United States Patent [19]

Bartel et al.

[11] Patent Number: 5,722,706
[45] Date of Patent: Mar. 3, 1998

[54] MOTOR-VEHICLE DOOR LATCH WITH POSITION-SENSING SWITCH

[75] Inventors: Peter Bartel, Hattingen; Dirk Hundertmark, Herne, both of Germany

[73] Assignee: Kiekert Aktiengesellschaft, Heiligenhaus, Germany

[21] Appl. No.: 420,830

[22] Filed: Apr. 10, 1995

[30] Foreign Application Priority Data

| Apr. 13, 1994 | [DE] | Germany | 44 12 649.2 |
| Sep. 16, 1994 | [DE] | Germany | 44 33 042.1 |

[51] Int. Cl.[6] ........................ E05C 3/06
[52] U.S. Cl. ............... 292/216; 200/61.64; 292/340; 292/201
[58] Field of Search ............ 70/432, 434; 200/61.64, 200/61.67, 61.68; 292/201, 216, DIG. 23, DIG. 56, 340, 341.12, 341.15–341.17

[56] References Cited

U.S. PATENT DOCUMENTS

| 3,309,128 | 3/1967 | Nash | 292/341.12 X |
| 3,857,001 | 12/1974 | Quantz | 200/61.64 |
| 4,249,161 | 2/1981 | Mohnhaupt | 200/61.64 |
| 4,497,513 | 2/1985 | Sasaki | 292/340 X |
| 4,806,712 | 2/1989 | Hoffman et al. | 200/61.64 X |
| 4,814,557 | 3/1989 | Kato | 292/216 X |
| 4,896,908 | 1/1990 | Kleefeldt | 292/340 X |
| 4,927,196 | 5/1990 | Girard et al. | 292/216 X |
| 5,032,697 | 7/1991 | Schilling et al. | 200/61.64 X |
| 5,137,311 | 8/1992 | Brackmann et al. | 292/216 |
| 5,236,234 | 8/1993 | Norman | 292/216 X |
| 5,273,324 | 12/1993 | Kobayashi | 292/216 X |

FOREIGN PATENT DOCUMENTS

| 2567185 | 1/1986 | France | 70/432 |
| 2728042 | 1/1979 | Germany | 70/432 |
| 3941086 | 6/1991 | Germany | 70/432 |

Primary Examiner—Suzanne Dino
Attorney, Agent, or Firm—Herbert Dubno; Andrew Wilford

[57] ABSTRACT

A motor-vehicle door latch for securing a door to a doorpost has a support mounted on a doorpost, a bolt projecting from the support, and a latch fork pivoted on the door, including a switch-actuating part, and movable between an engaged position interfitting with the bolt and retaining the door in a closed position fixed relative to the doorpost and a disengaged position out of engagement with the bolt and permitting the door to move relative to the doorpost. A switch on the support detects the position of the switch-actuating part and generates a door-closed output when the fork is in the engaged position and a door-open output when the fork is in the disengaged position.

5 Claims, 19 Drawing Sheets

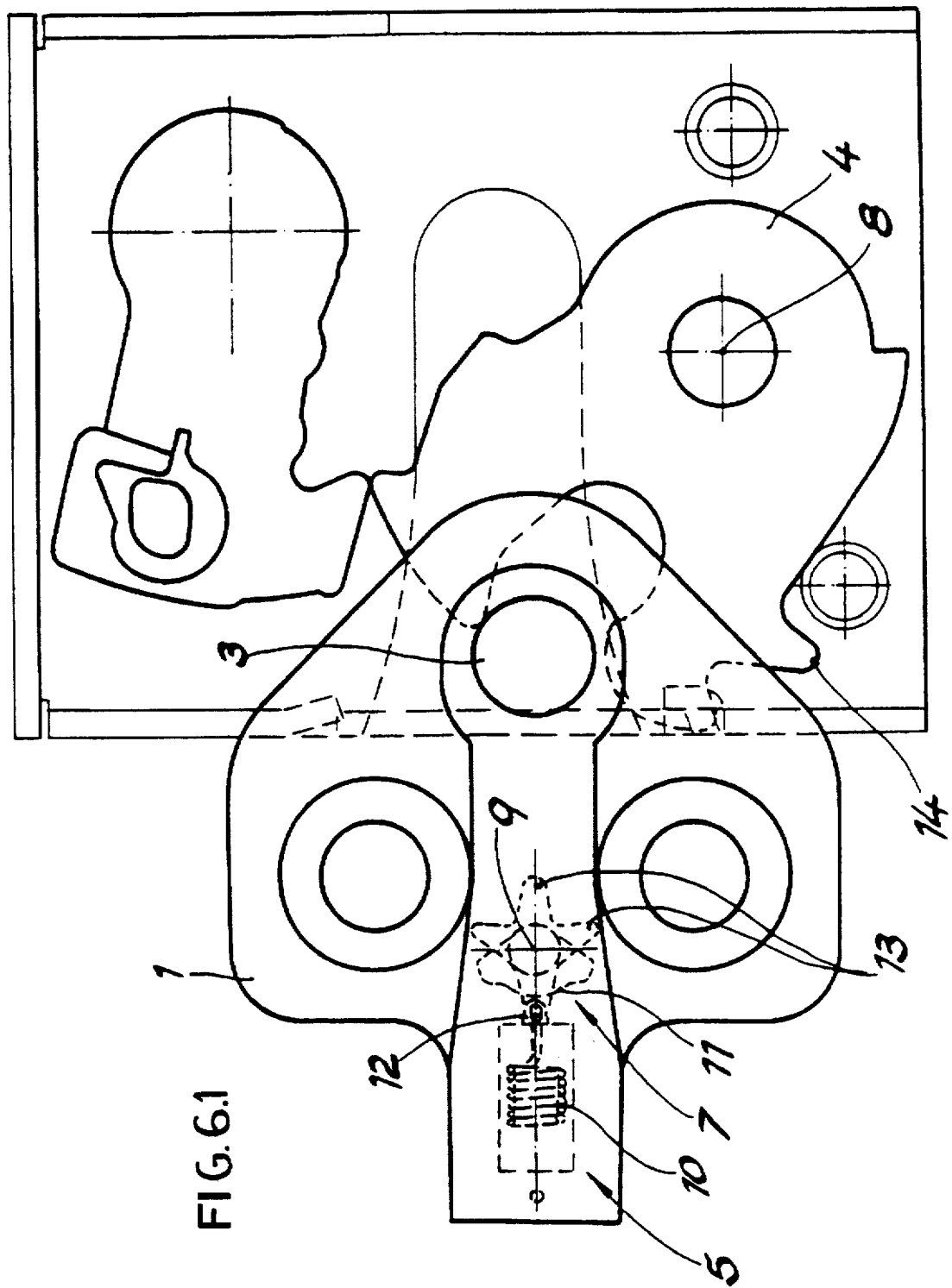
FIG.6.1

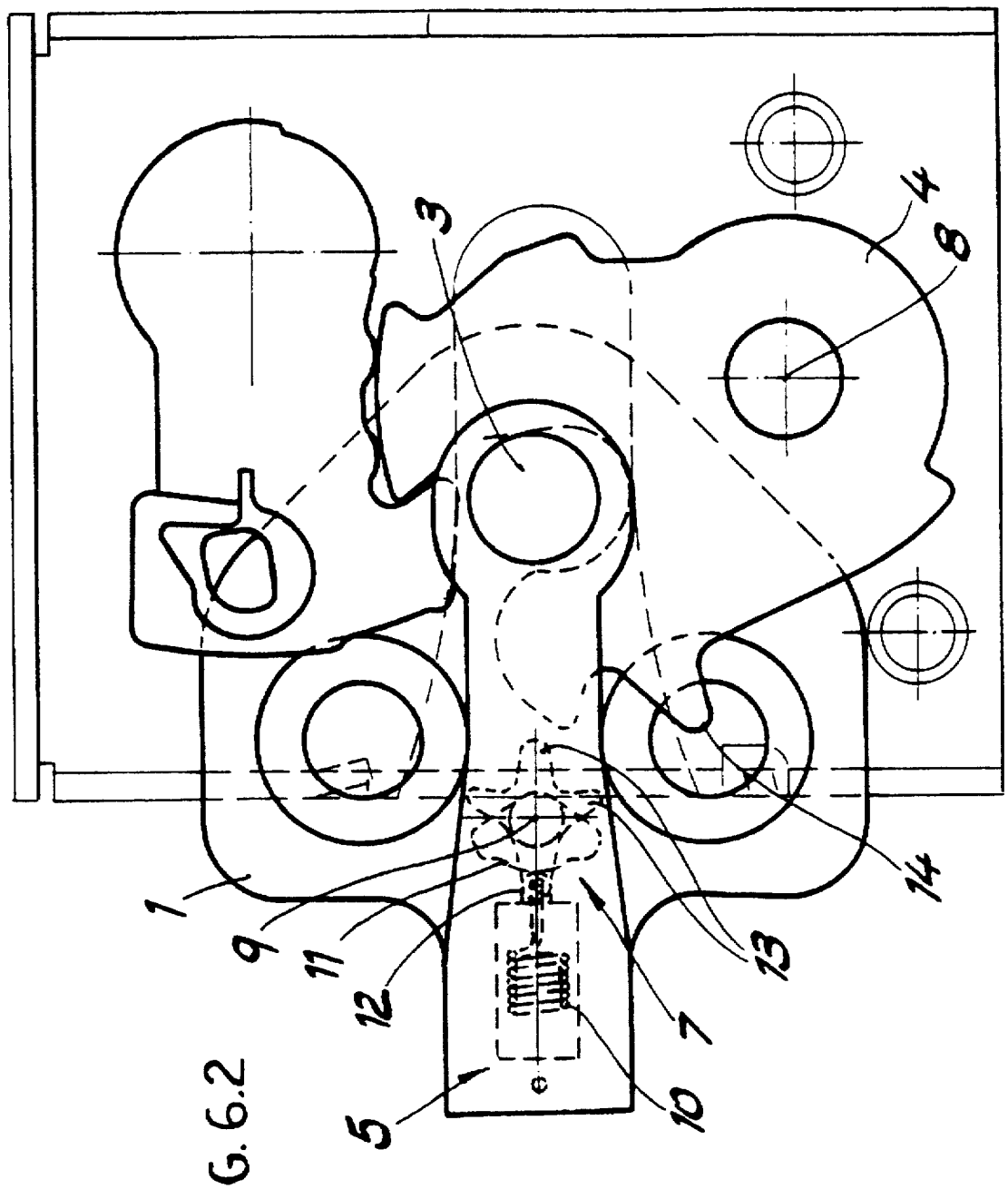
FIG.6.2

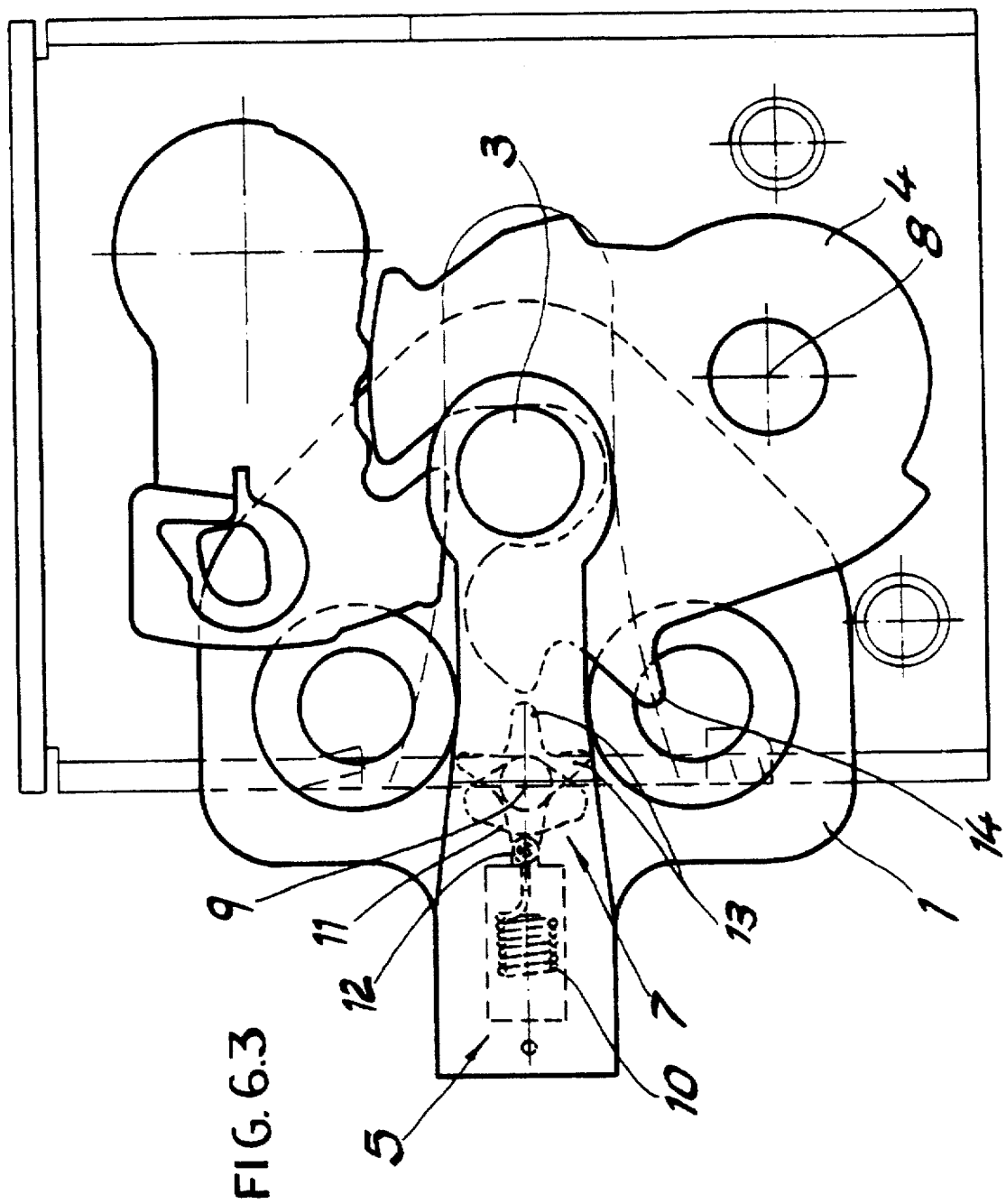
FIG. 6.3

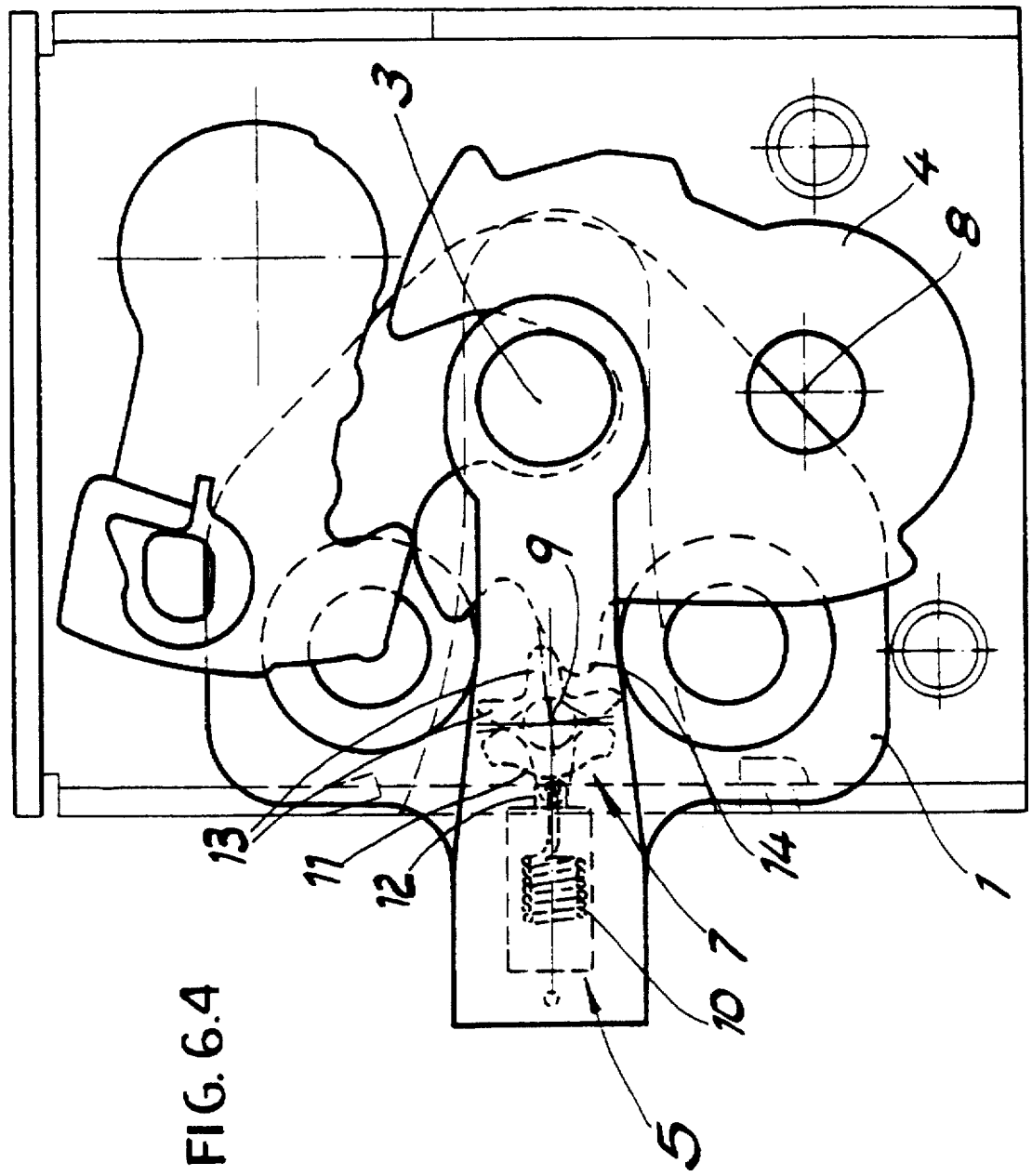

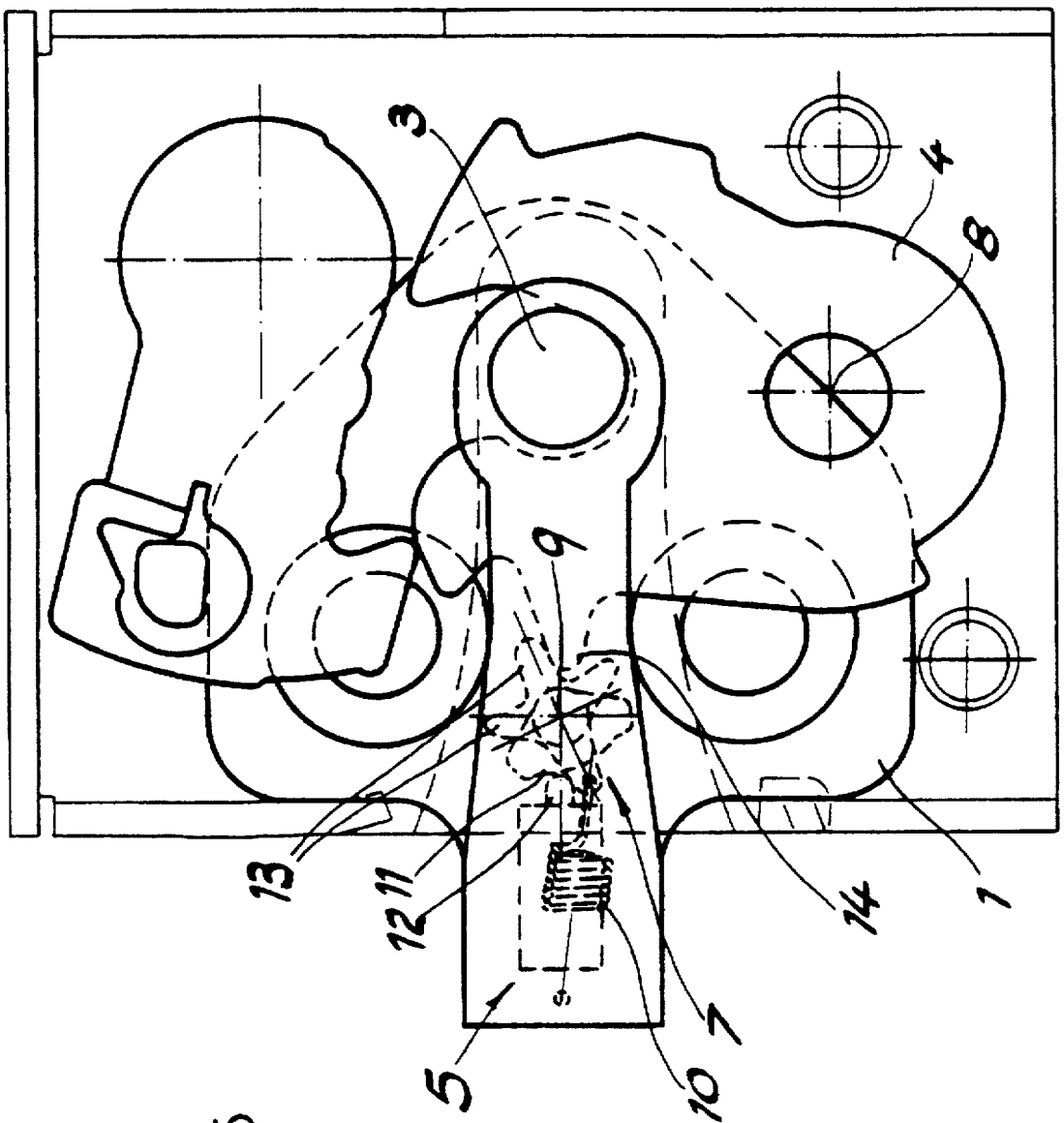
FIG. 6.5

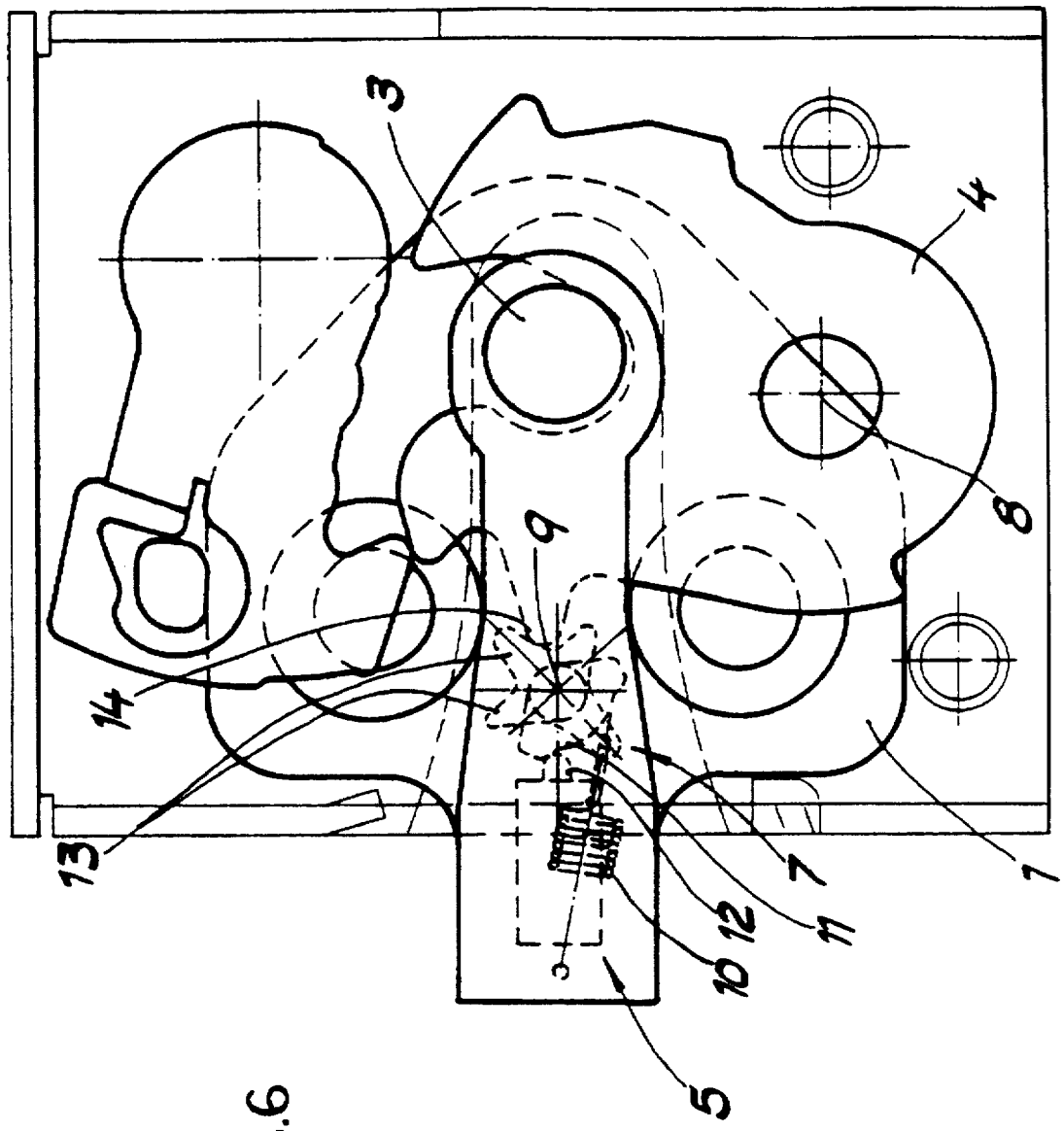
FIG. 6.6

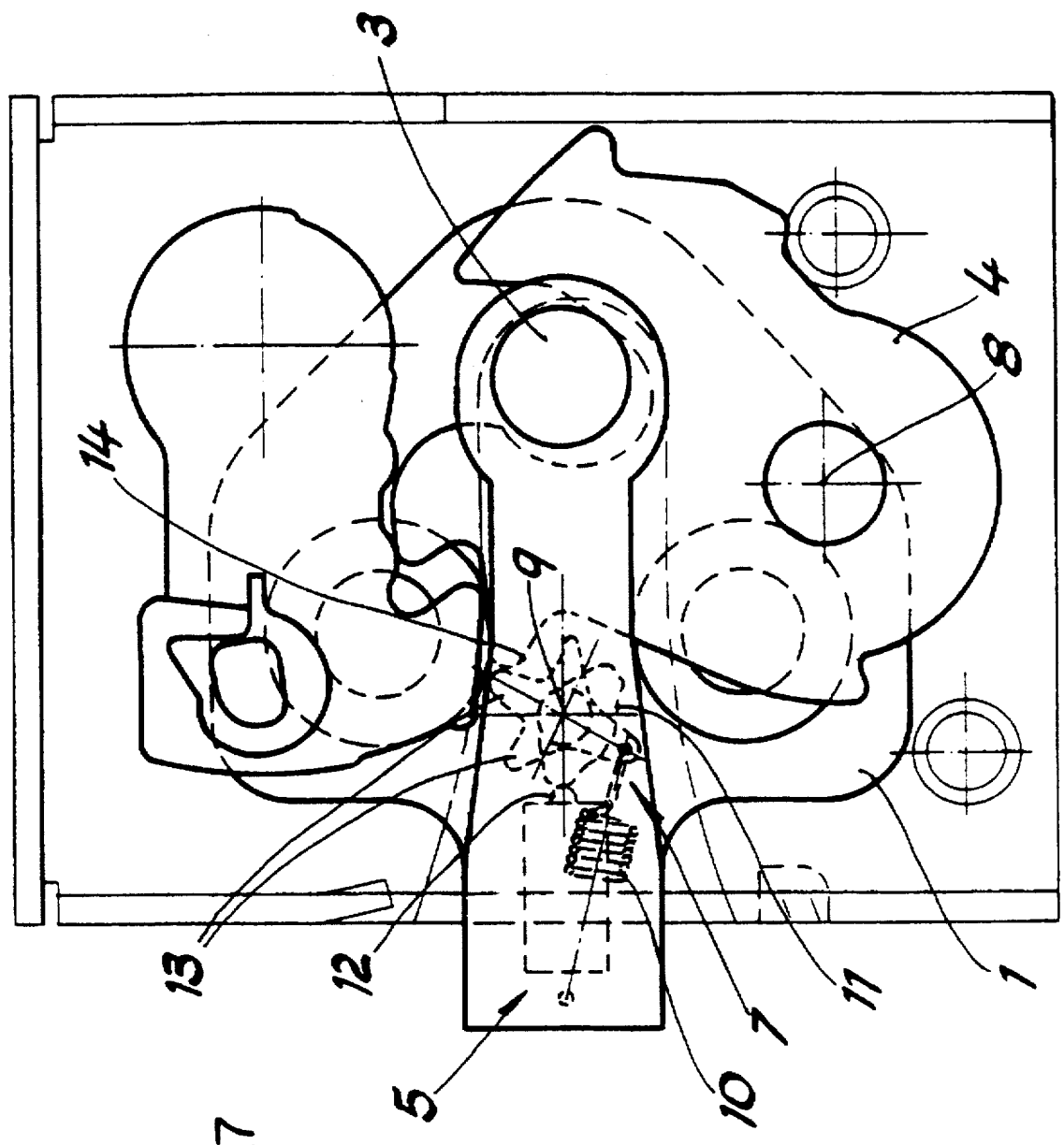
FIG.6.7

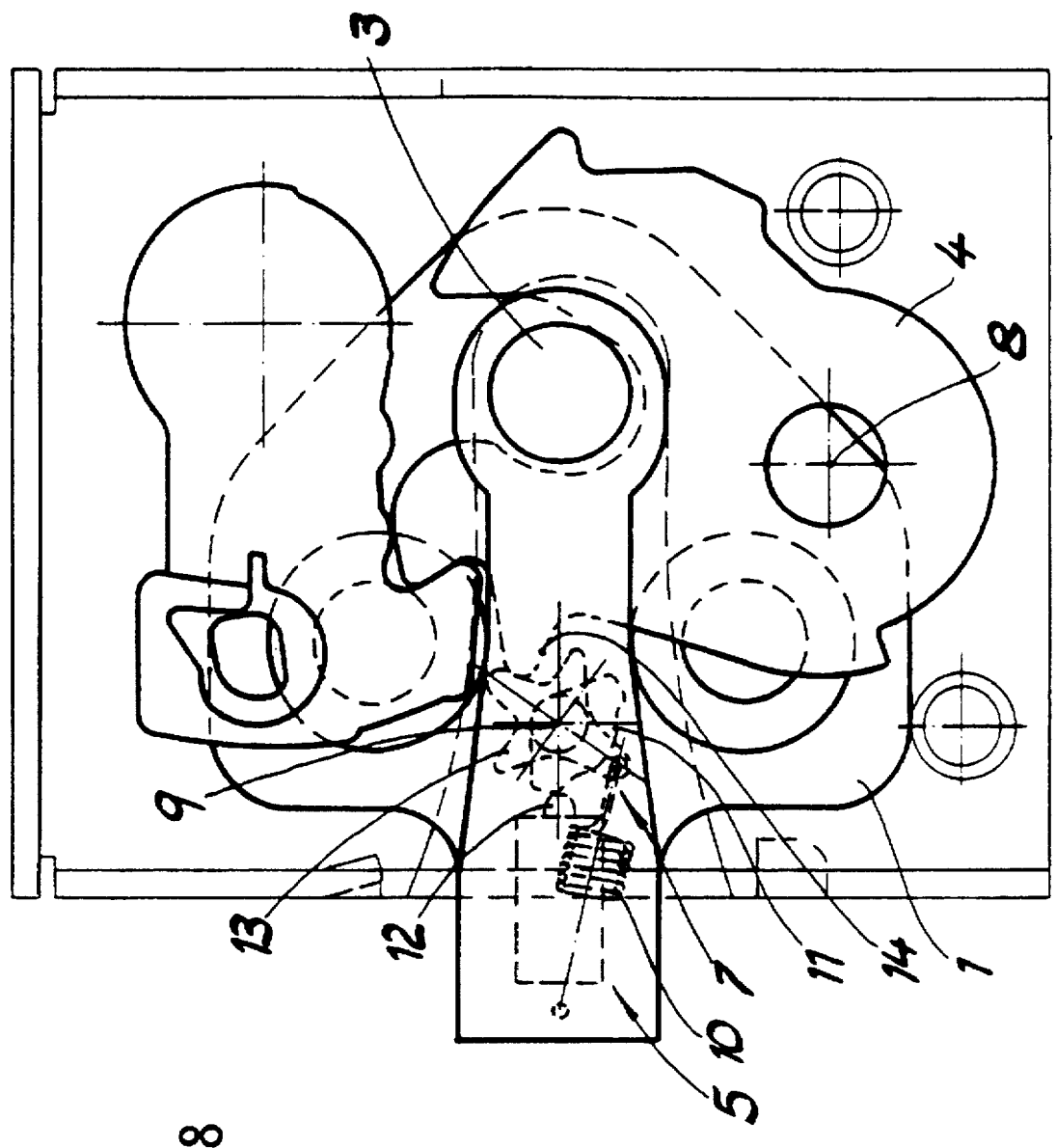
FIG. 6.8

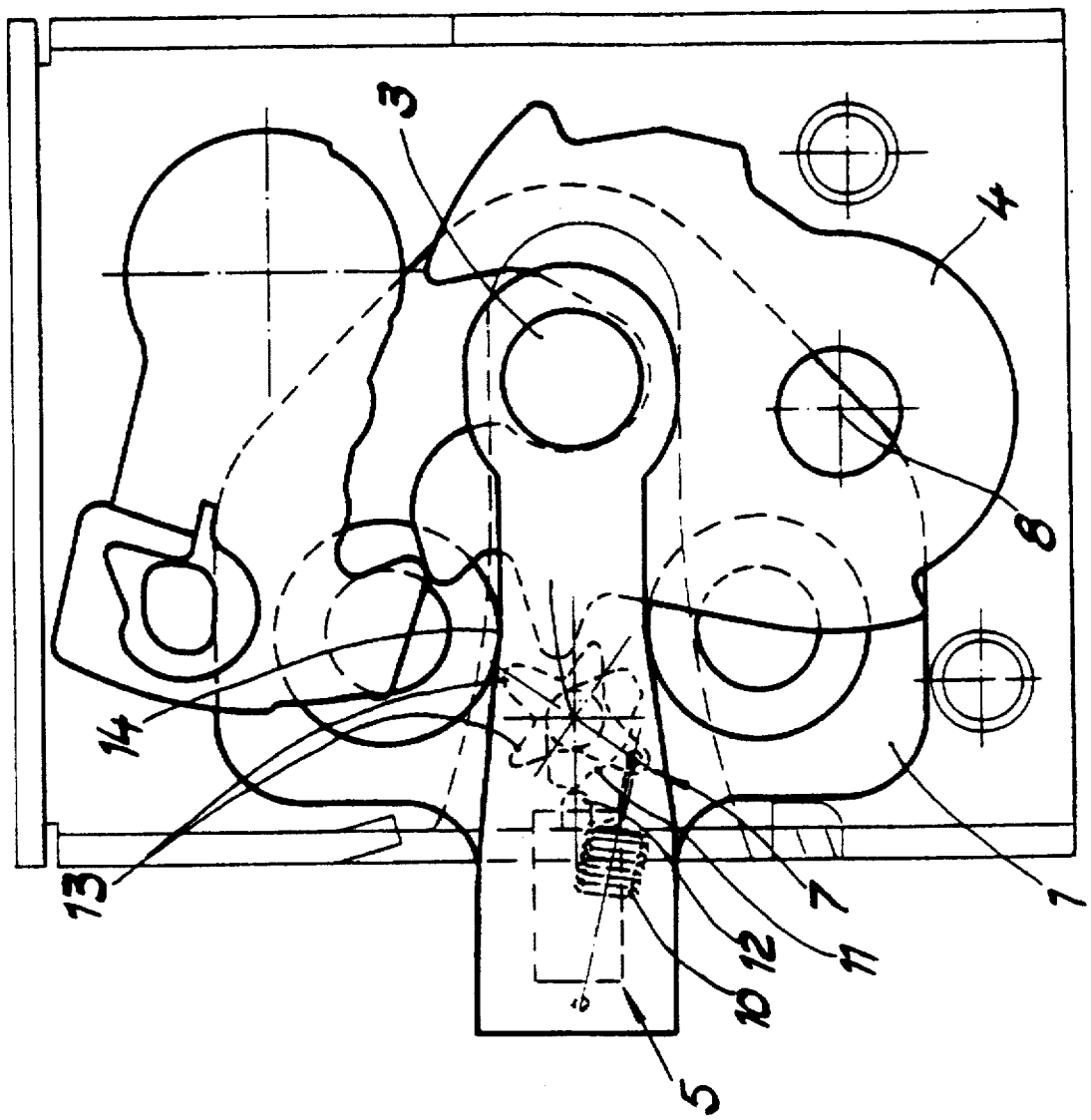
FIG.6.9

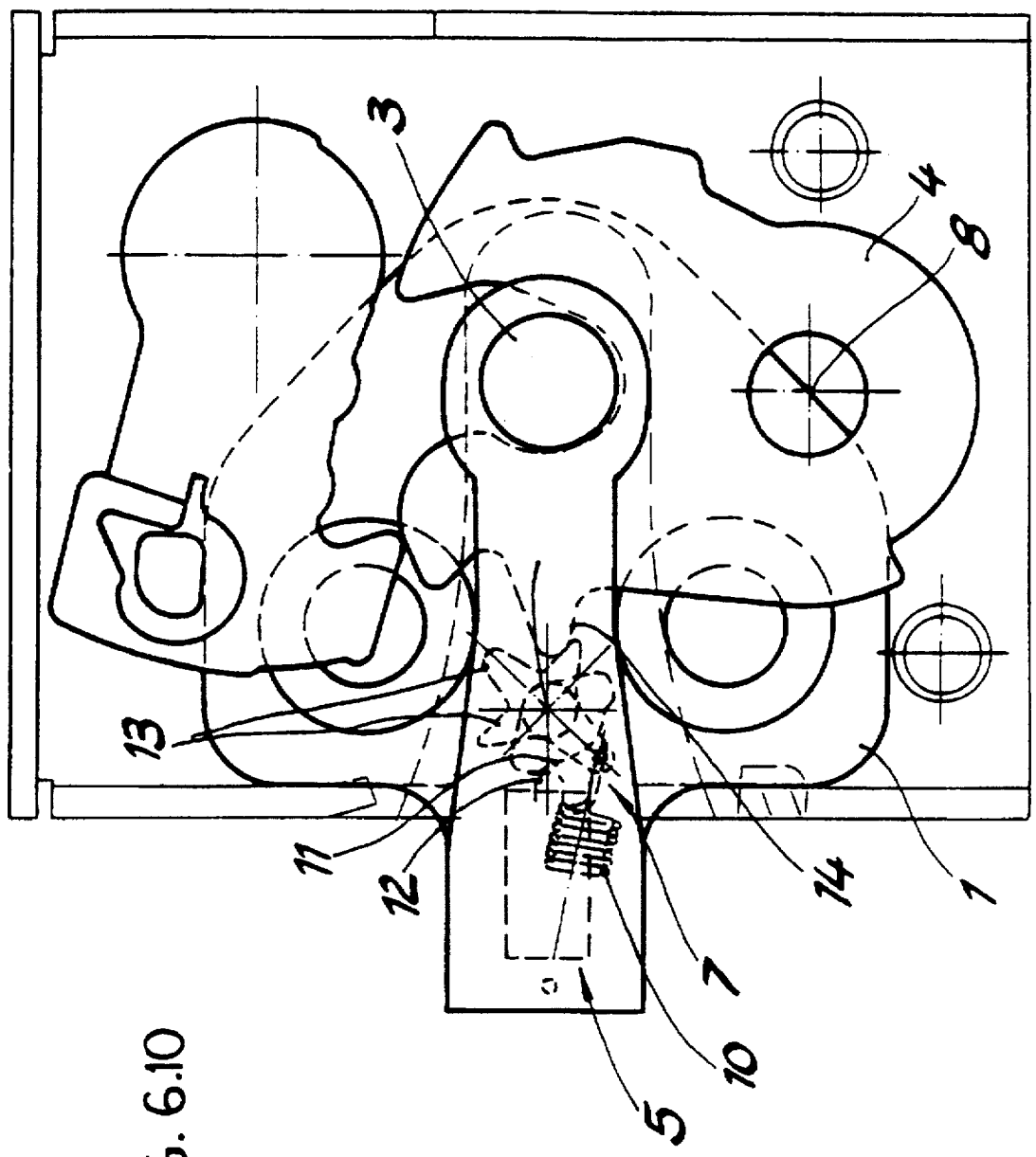
FIG. 6.10

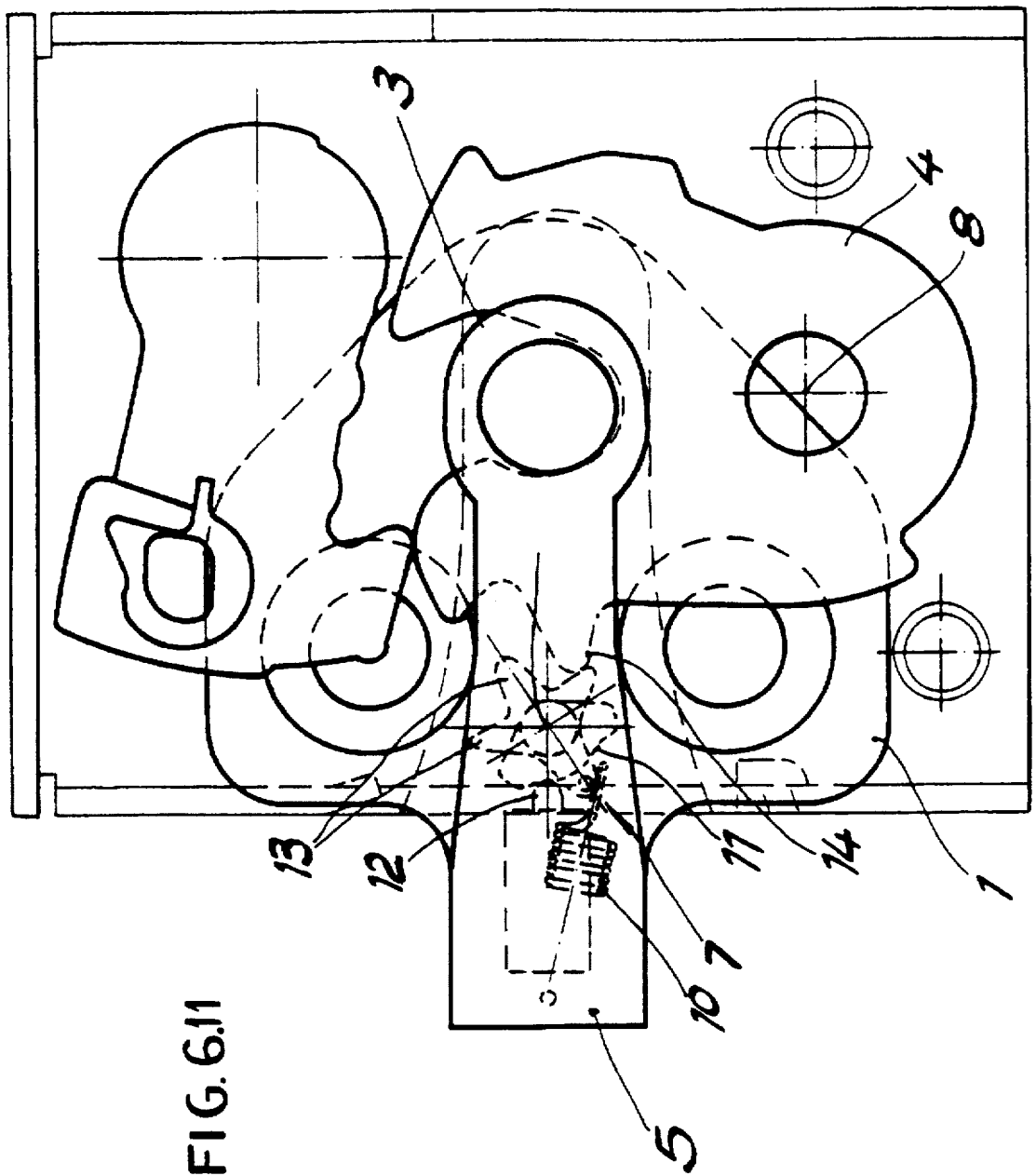
FIG.6.11

MOTOR-VEHICLE DOOR LATCH WITH POSITION-SENSING SWITCH

FIELD OF THE INVENTION

The present invention relates to a motor-vehicle door latch. More particularly this invention concerns such a latch that is equipped with a position-sensing switch that detects whether the door is open or closed.

BACKGROUND OF THE INVENTION

A motor-vehicle door latch typically comprises a bolt attached to and extending perpendicularly from the doorpost and a latch on the door edge. The latch has a pivotal fork that engages around the bolt to secure the door tightly in place. The bolt is typically part of an assembly comprised of a metallic U-shaped yoke having an inner flange adapted to be secured to the doorpost and an outer flange spaced therefrom, forming a fork-receiving space therewith, and having an outer surface turned away from the inner flange. The bolt is also metallic and is fixed to the two flanges so as to extend generally perpendicularly therebetween.

It is standard to provide at each door a switch which is actuated when the respective door is closed to signal to an on-board control system the condition of the door. Thus if a door is not fully closed a lamp on the dashboard will light to warn the driver of this potentially dangerous condition. As a rule a simple push-button switch is employed which is opened when engaged by a flange of the door. It is normally necessary for the door to be fully closed in order for its edge flange to actuate the switch, normally by depressing the button of the switch which projects outward and horizontally in the direction the door moves in when closing. The problem with this arrangement is that the switch is subjected to considerable physical shocks as the door is closed. In addition it is in a relatively exposed position on the door post. The result is a reduced service life for this switch.

Commonly owned U.S. Pat. No. 4,911,488 describes a motor-vehicle door-latch assembly for securing a door to a doorpost which has a latch fork pivoted on the door, a support mounted on a doorpost, and a bolt projecting from the support and engageable by the fork to retain the door against the doorpost. An electric switch mounted on the support adjacent the bolt is operated by an actuating element engageable by the fork on closing of the door to actuate the switch. Thus the switch can be tucked out of the way inside the post-mounted bolt assembly where it is not exposed to the elements. In addition according to this patent the fork has a curved camming edge which slides over the actuating element. As a result the switch is actuated gently even if the door is slammed, since the camming edge, which typically extends as a spiral centered on the rotation axis of the fork, can reduce a substantial travel of the door to a small travel of the actuating element.

In accordance with another feature of this earlier invention the actuating element includes a first plunger directly engageable with the camming edge and displaceable in the direction of movement of the door as it closes and a second plunger engaged between the first plunger and the switch and displaceable transversely of the direction and of the first plunger. This ensures that the switch is completely out of the way, and not actuated in the same direction as the jarring of the door as it closes, so that the problem with the prior-art structures, that a slamming door could just jar the switch into operation, is eliminated.

The problem with this system is that if the switch fails, it does so in the door-closed position. Thus if the lock ices up the plunger will stick in the depressed door-closed position even after the fork has left contact with it. Similarly if the door is damaged, for instance by someone jimmying it, the plunger is frequently wedged in place to output the door-closed signal even after the door is opened.

OBJECTS OF THE INVENTION

It is therefore an object of the present invention to provide an improved switched motor-vehicle door latch.

Another object is the provision of such an improved switched motor-vehicle door latch which overcomes the above-given disadvantages, that is which only outputs a door-closed signal when the latch is in the latched position, that is with the door closed.

SUMMARY OF THE INVENTION

A motor-vehicle door latch for securing a door to a doorpost has according to the invention a support mounted on a doorpost, a bolt projecting from the support, and a latch fork pivoted on the door, including a switch-actuating part, and movable between an engaged position interfitting with the bolt and retaining the door in a closed position fixed relative to the doorpost and a disengaged position out of engagement with the bolt and permitting the door to move relative to the doorpost. A switch on the support detects the position of the switch-actuating part and generates a door-closed output when the fork is in the engaged position and a door-open output when the fork is in the disengaged position.

Thus the switch according to this invention is positively influenced by the fork and is positively moved into the door-open position when the fork moves into the unengaged position. It can have a spring also urging it into this door-open position, but in any case is positively set in the door-open position when the door opens. The two outputs of the switch are therefore generated independently, binary fashion, by the rotation of the fork and the switch is positively actuated into the one or the other position.

The switch according to the invention includes an actuating element physically positively engageable with the fork on movement of the fork into and out of the engaged position. The actuating element and fork are pivotal about respective axes that are generally parallel when the fork is in the engaged position. The actuating part is a cam surface directly engageable with the actuating element. Thus the actuating part and element inter-engage like gears. Normally the actuating element has a cam surface and the switch has an operating button engageable with the cam surface of the actuating element. The actuating part is a radially projecting tooth of the fork and the actuating element has at least one radially projecting tooth engageable with the tooth of the actuating part.

In the switched motor-vehicle door latch the fork can travel on closing of the door past the engaged position into an overtravel position in which it maintains the switch in a position generating the door-closed output.

In another arrangement according to the invention the switch is a contactless proximity detector, for instance a hall-effect sensor or a reed switch. The fork can include a magnet movable past the sensor or the bolt housing can be provided adjacent the sensor with a magnet with the fork movable between the magnet and the sensor.

BRIEF DESCRIPTION OF THE DRAWING

The above and other objects, features, and advantages will become more readily apparent from the following description, reference being made to the accompanying drawing in which:

FIG. 2A is a large-scale view of a detail of FIG. 2;

FIGS. 6.1 through 6.11 show the latch moving from the open to the closed and to the open position;

FIG. 10 is a partly schematic view taken in the direction of arrow X of FIG. 9 of an alternative to the FIG. 9 embodiment; and FIG. 11 is a largely schematic view of another latch system according to the invention.

SPECIFIC DESCRIPTION

Figure 1:
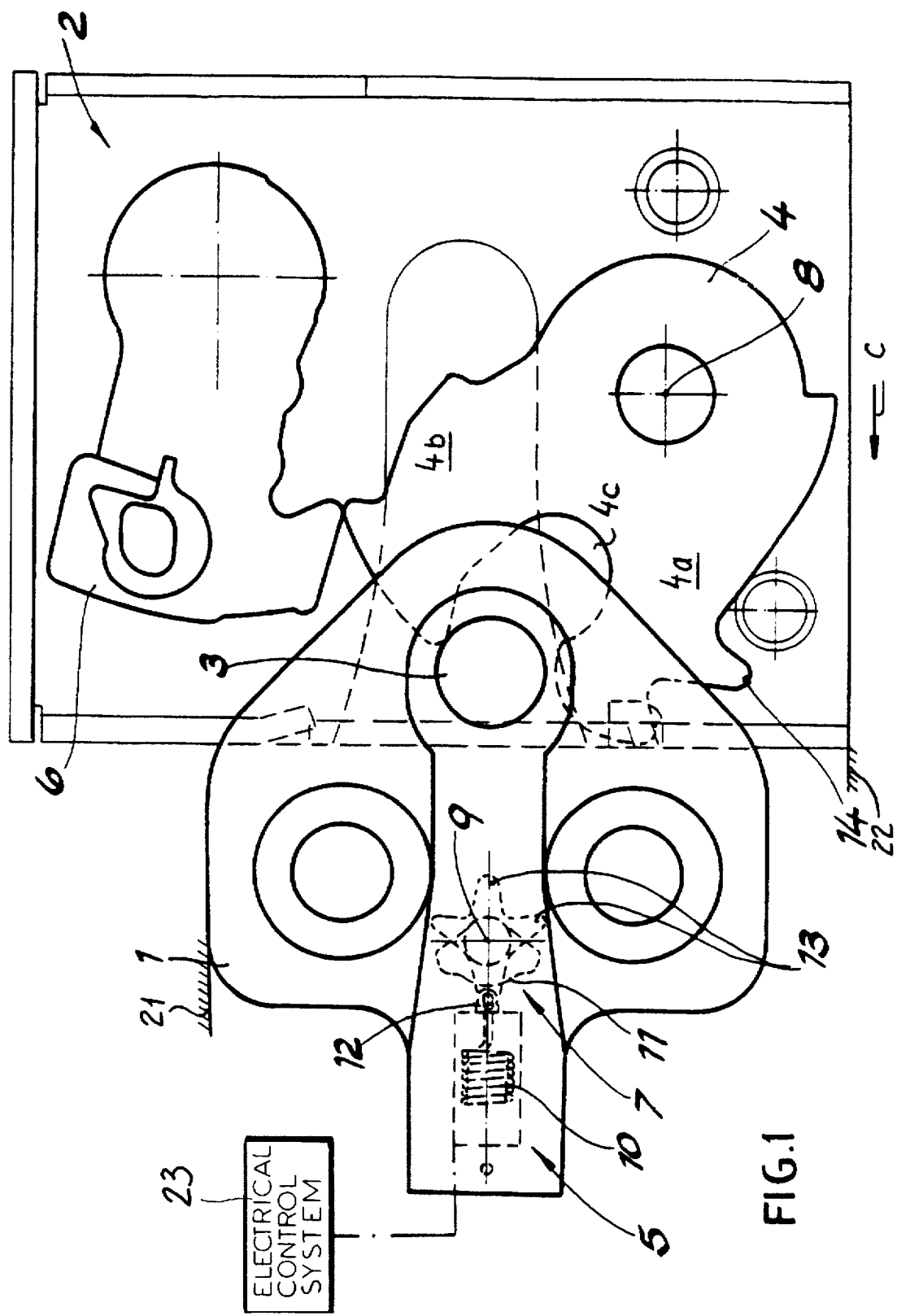
FIG. 1 is a partly schematic side view of the latch according to the invention in the open position
Figure 2:
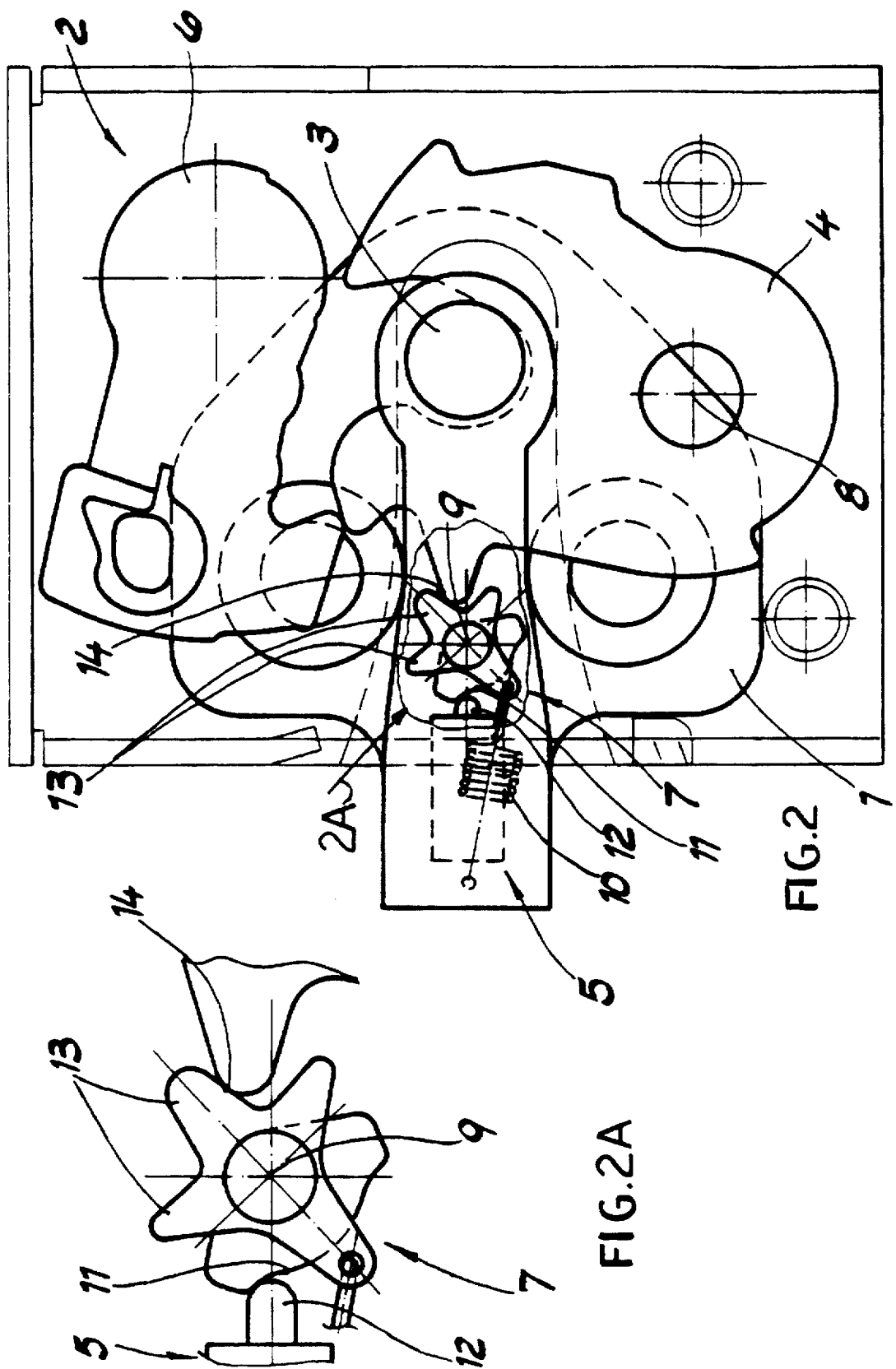
FIG. 2 is a view like FIG. 1 but with the latch in a partially closed position.

As seen in FIGS. 1 and 2 the latch according to this invention comprises a bolt assembly or support 1 mounted on a doorpost 21 and a latch housing 2 mounted on a door edge 22 and having a fork 4 mounted via a pivot pin 8 on the housing 2. The bolt assembly 1 comprises a U-shaped sheet-metal yoke having a pair of flanges bridged by a standard latch bolt 3 which is here mounted rivet--fashion in these flanges and extends perpendicular to them. A spring-loaded pawl 6 on the latch housing 2 can free the fork 4 to rotate about the pivot 8. The fork 4 has a pair of legs 4a and 4b defining a recess 4c that can fit over the bolt 3 so that the leg 4a engages behind the bolt 3.

Figure 3:
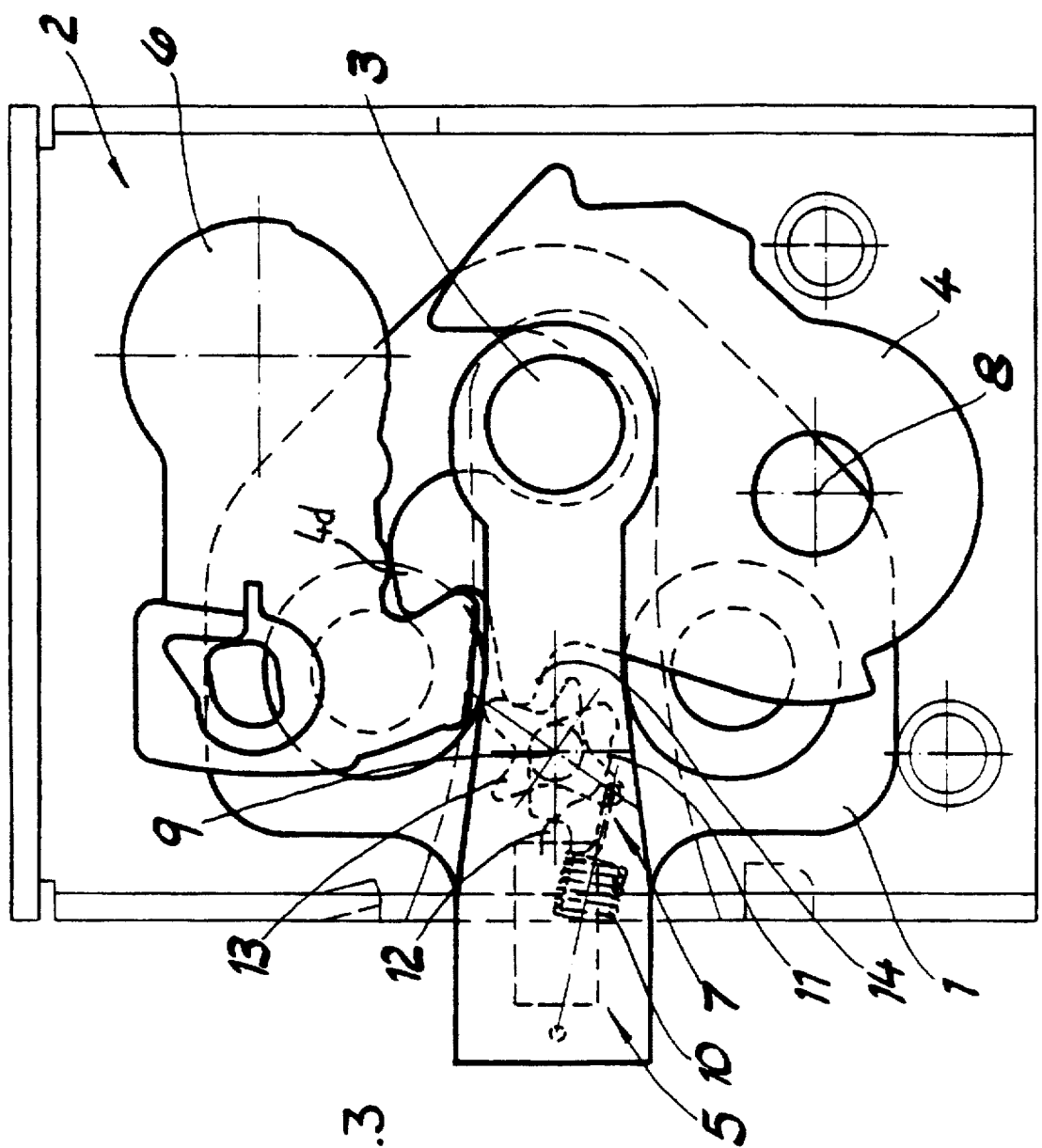
FIGS. 3, 4, and 5 are further views like FIG. 1 showing the latch in further positions.

More particularly as is standard when the door 22 is closed in direction C as shown in FIG. 1 the bolt 3 engages in the cutout 4c and pivots the fork 4 clockwise until the pawl 6 catches over a tooth 4d of the fork as shown in FIG. 3. In this position the door is closed and latched, the leg 4a effectively preventing the assembly 1 from pulling out of the housing 2.

According to the invention a switch 5 is mounted in the bolt assembly 1 and is connected to the vehicle's electronic control system 23. This switch 5 has an actuation button 12 movable in the closing direction C to move the switch 5 between a position generating a door-closed output and a position generating a door-open output. One of these outputs is normally constituted as a very low-resistance switch-closed condition and the other as a very high-resistance switch-open condition.

Figure 4:
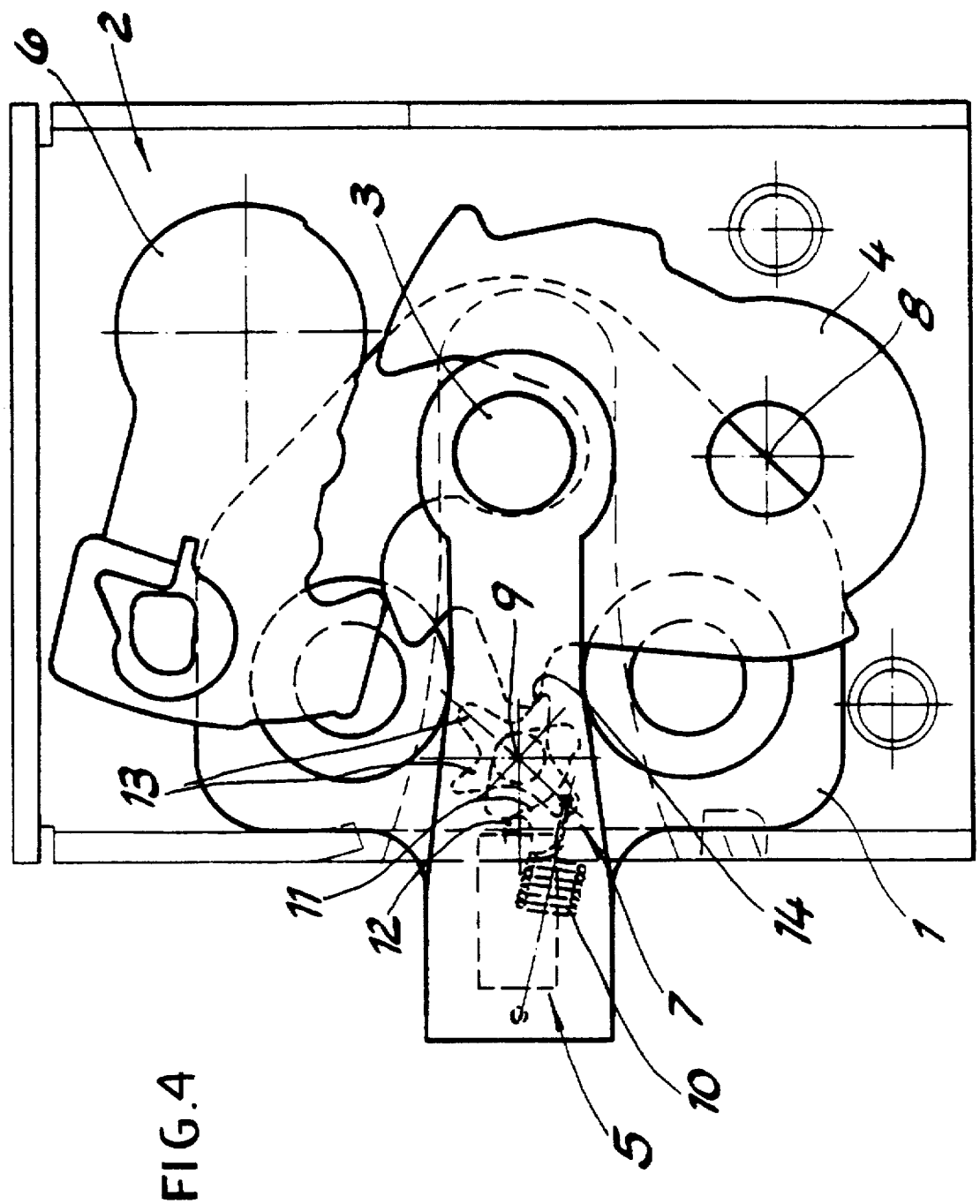
Figure 5:
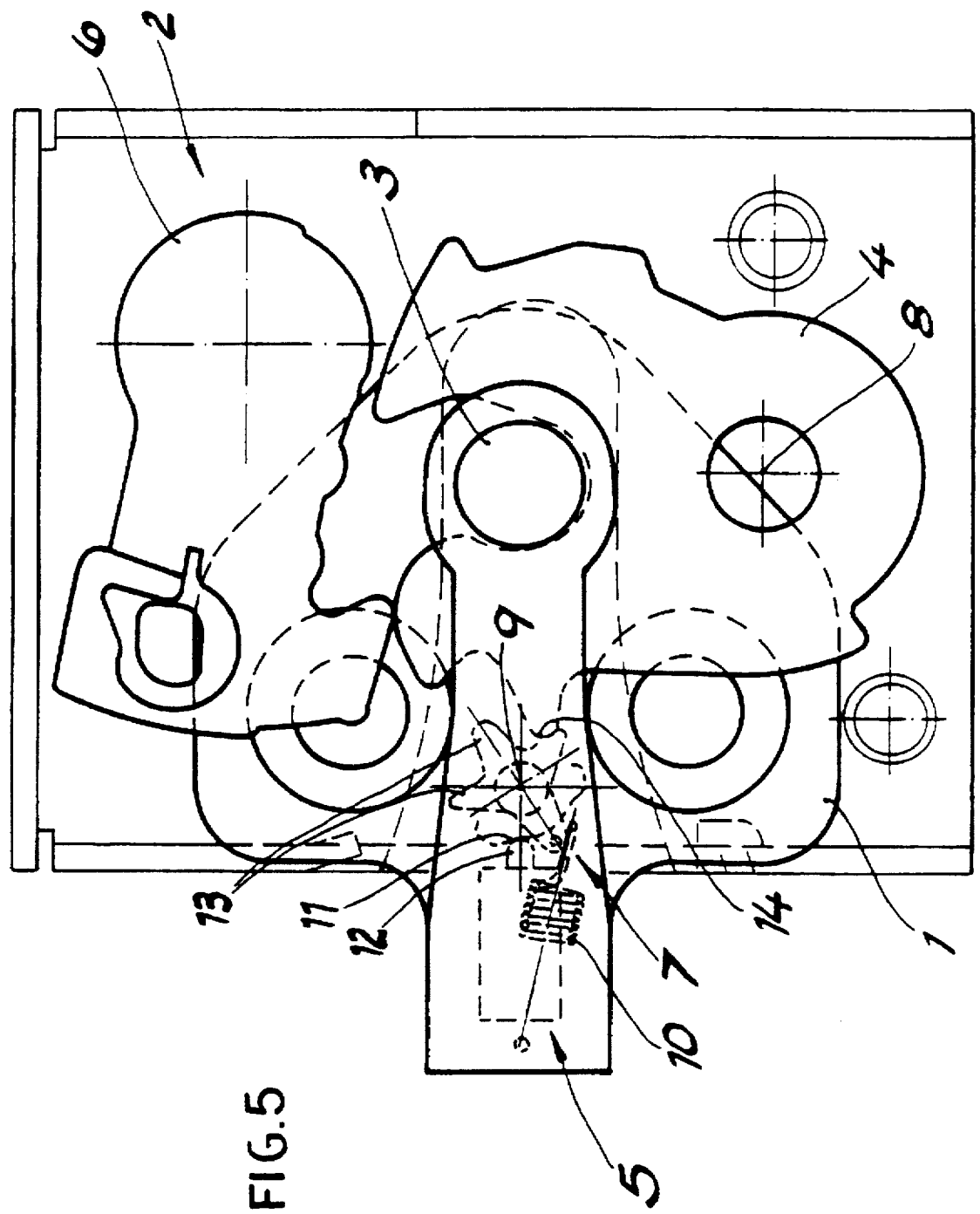

According to the invention the bolt assembly 1 carries a pivotal switch-actuating member 7 pivotal about an axis 9 parallel to the bolt 3 directly between this bolt 3 and the switch 5. This member 7 has three angularly spaced and radially projecting arms 13 that can interact with an actuation part or tooth 14 formed on the arm 4a of the fork 4. In addition this member 7 has an inwardly directed cam formation 11 engageable with the actuation button 12 of the switch 5. A spring 10 continuously urges the member 7 into a position allowing the button 12 to protrude outward, which corresponds to the door-open position in which the switch 5 generates the door-open output. The three-armed member 7 acts like a gear or Maltese-cross linkage with the part 14 to actuate the switch 5 whenever the fork 4 moves into the closed position. As the latch moves from the fully open position of FIG. 1 through the partially closed position of FIG. 2 to the fully closed position of FIG. 3, passing through the intermediate position of FIG. 2, the part 14 engages the member 7 and tips it about its pivot 9, causing the door-closed output to be generated. When moved from the fully closed position of FIG. 3 through the partially open positions of FIGS. 4 and 5, the part 14 again trips the member 7 and tips it back into its door-open position.

This operation is more particularly described in FIGS. 6.1 through 6.11:

FIG. 6.1 (which is identical to FIG. 1) shows the fork 4 in the open position. The element 7 is unactuated so that the switch 5 is also not actuated.

FIG. 6.2 shows the door partly shut with the fork 4 in the partially latched position. The element 7 is still unactuated like the switch 5.

In FIG. 6.3 the fork 4 is on its way from the partially latched position to the fully latched position. Even here the element 7 and switch 5 are not actuated.

FIG. 6.4 shows the fork slightly further along its way to the fully latched position and FIG. 6.5 shows the position slightly more advanced. The fork 4 is in fact engaging the element 7 with its actuator 14, but not enough to operate the switch 5 because the latch is not yet in its fully closed position.

In FIG. 6.6 (which is identical to FIG. 2) the fork 4 is almost to its fully latched position. The element 7 is actuated and in turn is actuating the switch 5 with its cam surface 11.

FIG. 6.7 shows a standard overtravel position where the fork has been pivoted slightly past its fully latched position, as happens when the door is slammed or shut forcibly. In it the switch 5 remains actuated.

FIG. 6.8 (which is identical to FIG. 3) shows the door in the latched position with the tooth 14 physically engaging one of the formations 13 to hold the element 7 in the actuated position, thereby retaining the switch 5 also in the actuated position.

FIG. 6.9 shows when the pawl 6 has just released the fork 4 which has started moving out. The element 7 remains in contact with the switch 5, holding it in the actuated position.

In FIG. 6.10 (which is identical to FIG. 4) the fork 4 has moved significantly out but the element 7 still is holding the switch 5 in the actuated position.

Finally, FIG. 6.11 (which is identical to FIG. 5) shows how the actuating formation 14 positively engages the element 7 and deactuates the switch 5. Thus the switch 5 is positively moved to the door-open position as the fork 4 moves into the open position. Even if the spring 10 were broken, the switch 5 would be actuated into the door-open position.

Figure 7:
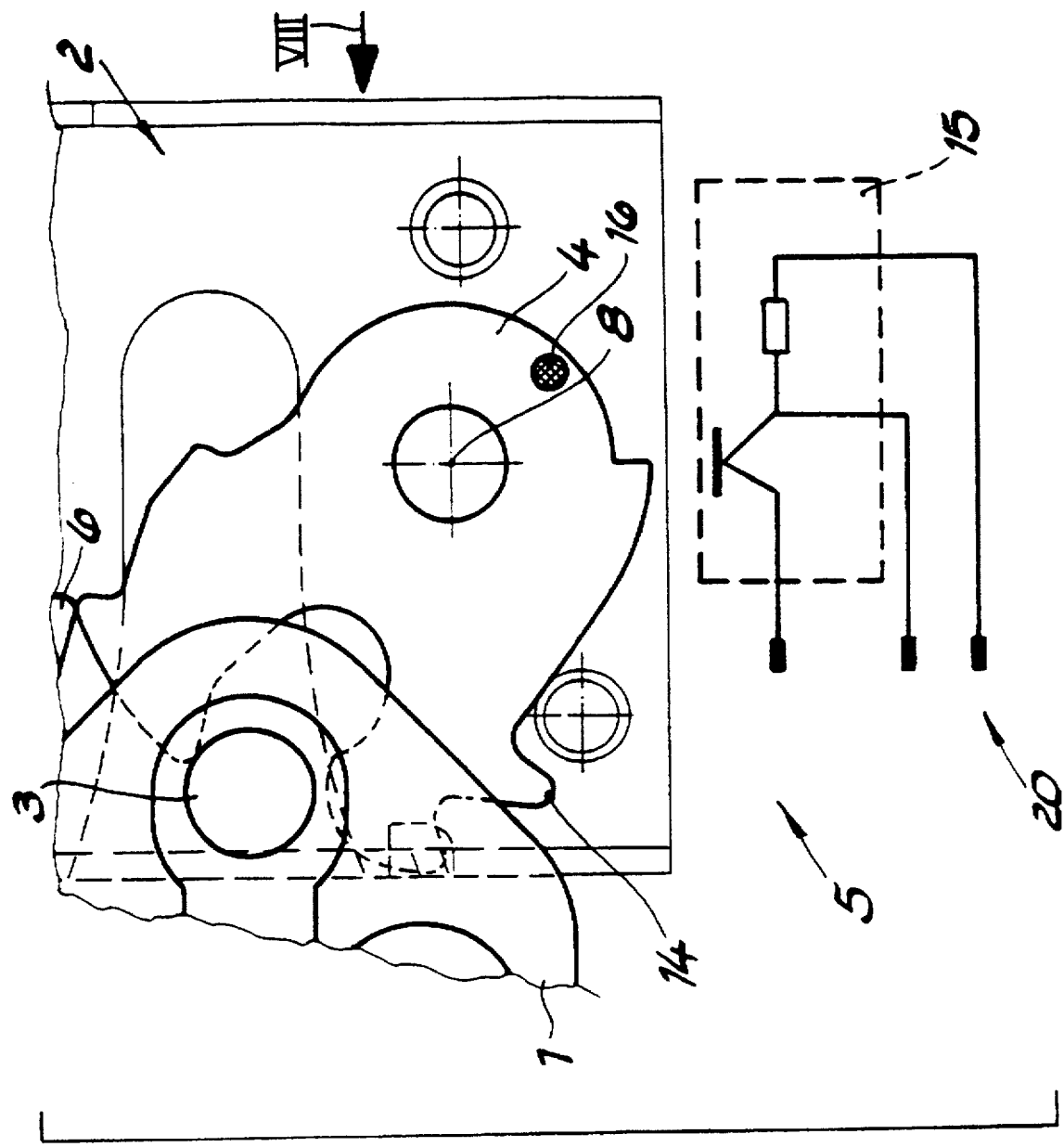
FIG. 7 is a view like FIG. 1 of another latch according to the invention.
Figure 8:
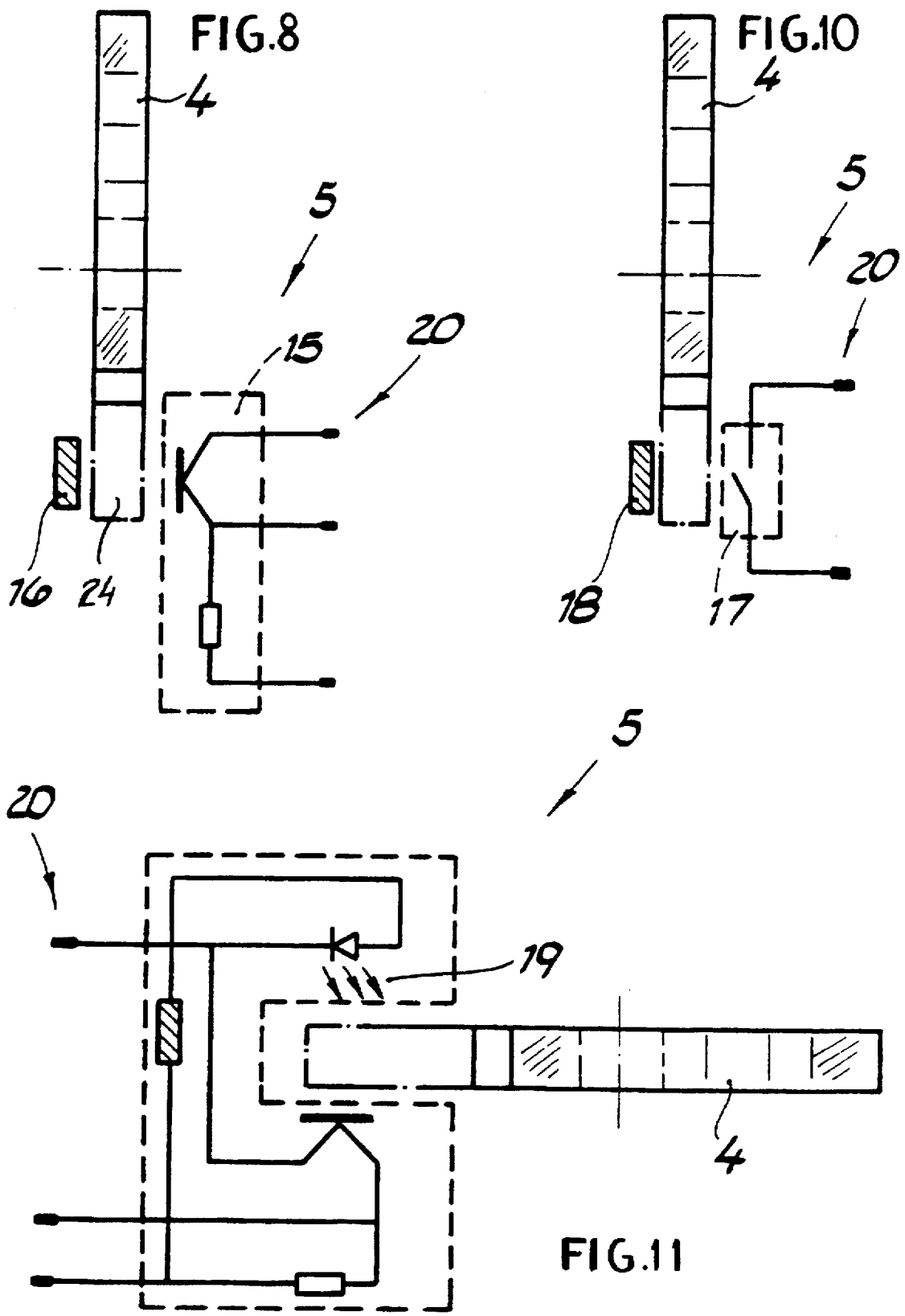
FIG. 8 is a partly schematic view taken in the direction of arrow VIII of FIG. 7 of an alternative to the FIG. 7 embodiment.

In the arrangement of FIG. 7 the switch 5 includes a hall-effect detector 15 that coacts with a small permanent magnet 16 imbedded in the fork 4 offset from its pivot 8. In FIG. 8 the magnet 16 is positioned on the opposite side of fork 4 so that when a notch or cutback portion 24 of the fork 4 comes between the magnet 16 and the sensor 15 it shields the sensor 15 from the magnet 16.

Figure 9:
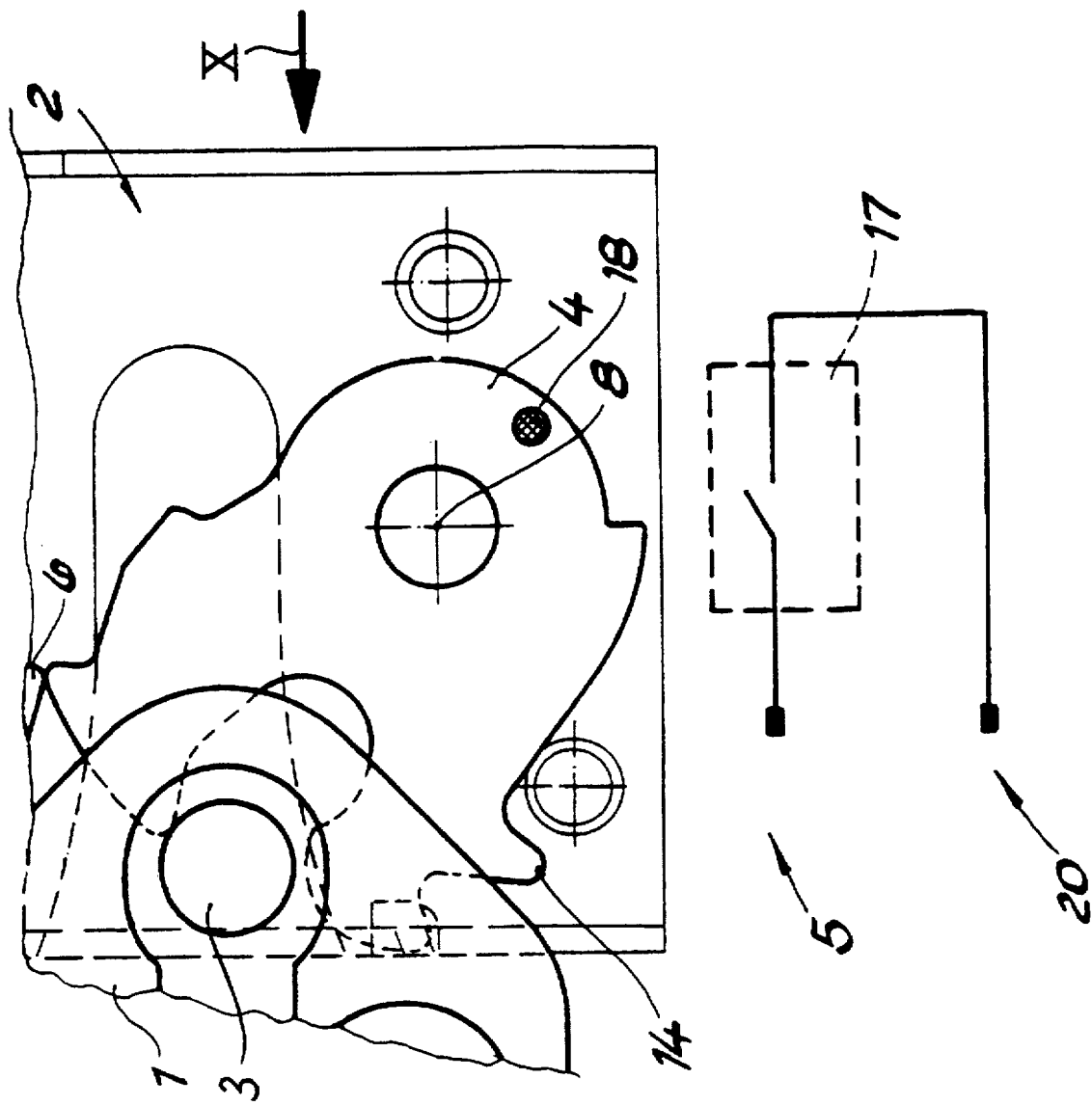
FIG. 9 is another view like FIG. 1 of another latch according to the invention.

The system of FIG. 9 has a magnet 18 imbedded in the fork 4 and operating a reed switch 17 of the switch 5. Similarly to FIG. 8, in FIG. 10 the magnet 18 is on the opposite side of the fork 4.

FIG. 11 has a small photocell assembly 19 in the switch 5, with a light-emitting diode on one side of the fork 4 and a photocell on the other. As in FIGS. 7–10, contacts 20 of the switch 5 are connected to the control system shown at 23 in FIG. 1.

We claim:

1. A motor-vehicle door latch for securing a door to a doorpost, the latch comprising:

a support mounted on a doorpost;

a bolt projecting from the support;

a latch fork pivoted on the door, formed with a switch-actuating tooth, and movable between an engaged position interfitting with the bolt and retaining the door in a closed position fixed relative to the doorpost and a disengaged position out of engagement with the bolt and permitting the door to move relative to the doorpost;

a switch on the support displaceable between a position with the switch generating a door-closed output and another position with the switch generating a door-open output;

actuating means including an actuating element formed with a tooth operated directly by the actuating tooth of the fork and cooperating with the switch for on movement of the door into the closed position positively physically pushing the switch into the position generating the door-closed output and holding the switch in the position generating the door-closed output so long as the door is in the closed position and on movement of the door into the open position positively releasing the switch and physically pushing the switch into the position generating the door-open output; and a spring connected to the actuating element and urging the switch into a position generating the door-open output.

2. The switched motor-vehicle door latch defined in claim 1 wherein the actuating element and fork are pivotal about respective axes that are generally parallel when the fork is in the engaged position.

3. The switched motor-vehicle door latch defined in claim 1 wherein the actuating tooth and actuating element interengage like gears.

4. The switched motor-vehicle door latch defined in claim 2 wherein the actuating element has a cam surface and the switch has an operating button engageable with the cam surface of the actuating element.

5. The switched motor-vehicle door latch defined in claim 1 wherein the fork can travel on closing of the door past the engaged position into an overtravel position in which it maintains the switch in a position generating the door-closed output.

* * * * *